United States Patent [19]

Allen

[11] Patent Number: 4,910,866

[45] Date of Patent: Mar. 27, 1990

[54] METHOD OF MANUFACTURING A SERIES OF LEADFRAME STRIP CARRIERS HAVING FIXED EXTERNAL DIMENSIONS AND VARIED INTERNAL DIMENSIONS USING A COMMON MOLD

[75] Inventor: Timothy J. Allen, Boise, Id.

[73] Assignee: Micron Technology, Inc., Boise, Id.

[21] Appl. No.: 313,090

[22] Filed: Feb. 21, 1989

[51] Int. Cl.$^4$ ............................................. H01R 43/00
[52] U.S. Cl. ........................................ 29/827; 29/463; 29/527.1
[58] Field of Search ...................... 29/827, 463, 527.1; 264/248, 250, 328.1, 334l272.14, 272.17; 249/156, 184, 144, 176; 211/71, 72, 126

[56] References Cited

U.S. PATENT DOCUMENTS

| | | | |
|---|---|---|---|
| 3,363,039 | 1/1963 | Nagai et al. | 249/156 |
| 3,949,891 | 4/1976 | Butler et al. | 211/126 |
| 4,616,754 | 10/1986 | Heinzl et al. | 264/328.1 |

*Primary Examiner*—Timothy V. Eley
*Assistant Examiner*—Irene Cuda
*Attorney, Agent, or Firm*—Angus C. Fox; Stan Protigal; Jon Busack

[57] ABSTRACT

A method of manufacturing a series of leadframe strip carriers, the individual members of the series having common external dimensions to facilitate production handling equipment setup and internal slot dimensions which vary to accommodate the various widths of available leadframe strips. This new method of manufacturing leadframe strip carriers results in a much lower unit cost, as compared to carriers manufactured from aluminum extrusions. This has been achieved using an injection molding process employing a single mold which produces constant length, width and height dimensions throughout the series, and which has an internal form die, the position of which can be varied with spacing inserts that can be either removed or transferred to the other side of the mold cavity as the mold is modified for progressively-narrower leadframe strips. To ensure durability, highly-abrasion resistant, fiber-reinforced plastic material is used to create the carriers. Although the carriers could be molded as an integral unit, mold construction is greatly simplified by molding two identical halves and bonding them together. In order to simplify manufacturing of the carriers, end cap grooves are molded at both ends.

8 Claims, 9 Drawing Sheets

METHOD OF MANUFACTURING A SERIES OF LEADFRAME STRIP CARRIERS HAVING FIXED EXTERNAL DIMENSIONS AND VARIED INTERNAL DIMENSIONS USING A COMMON MOLD

FIELD OF THE INVENTION

This invention relates to semiconductor manufacturing technology, and more specifically, to the design and manufacture of leadframe strip carriers.

BACKGROUND OF THE INVENTION

Integrated semiconductor devices are typically constructed en masse on a wafer of silicon or gallium arsenide. Each device generally takes the form of an integrated circuit (IC) die, which is bonded to the die-mounting paddle of a leadframe. The wire attachment pads on the die are connected with their corresponding leads on the leadframe with aluminum or gold wire during a wire bonding process. The die and leadframe are then encapsulated in a plastic or ceramic package, which is then recognizable as an IC "chip". Since nine or more leadframes are typically interconnected as a leadframe strip during the manufacturing process, a trim and form operation separates the individual chips from the strip and forms (bends) the leads of the chip into the required configuration. IC chips come in a variety of forms such as dynamic random access memory (DRAM) chips, static random access memory (SRAM) chips, read only memory (ROM) chips, gate arrays, and so forth. The chips are interconnected in myriad combinations on printed circuit boards, along with other types of discrete components such as resistors and capacitors, by any number of techniques, such as socketing and soldering.

Figure 1:
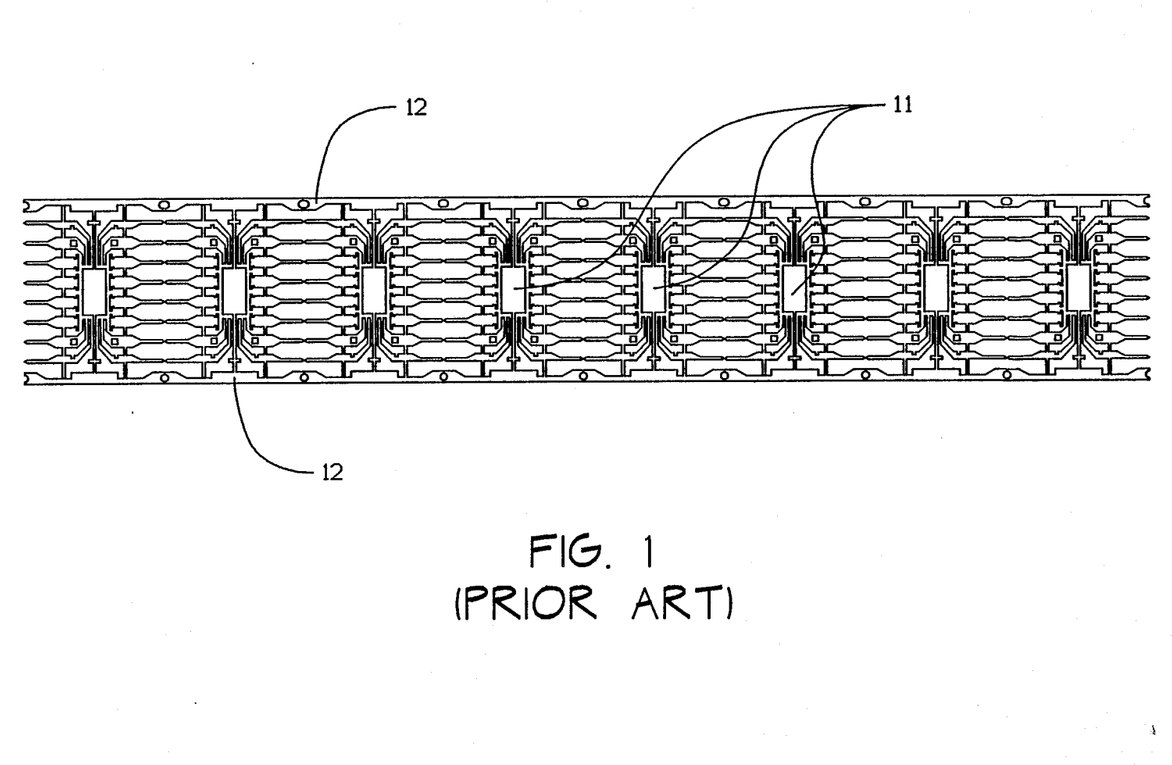
FIG. 1 is a top plan view of a typical leadframe strip.
Figure 2:
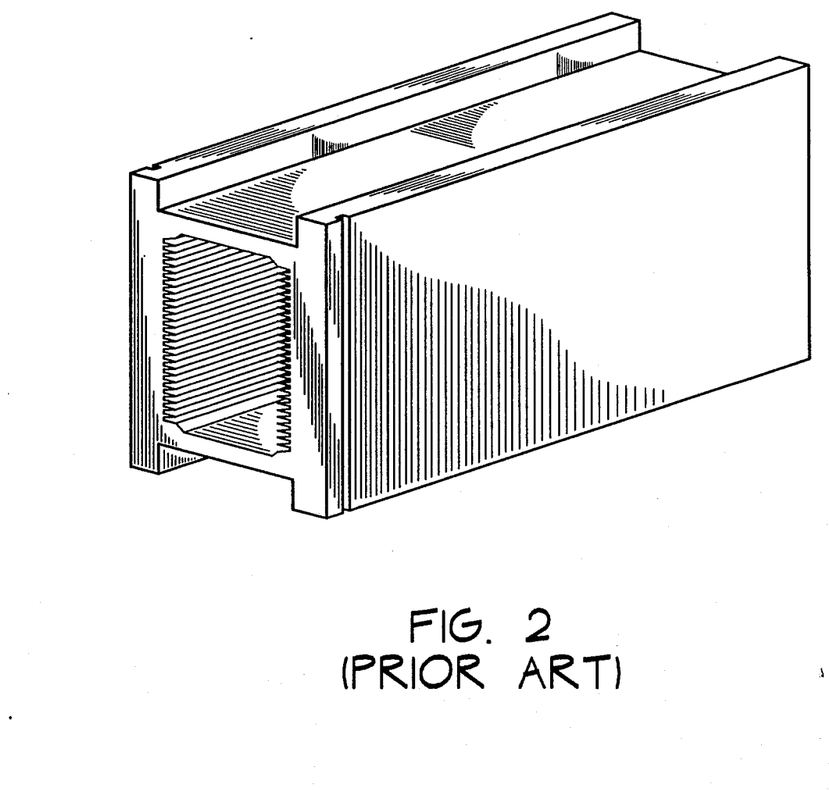
FIG. 2 is a perspective view of a typical leadframe strip carrier fashioned from an aluminum extrusion.

An example of a typical leadframe strip is depicted in FIG. 1. From the point in the manufacturing process where the paddles 11 of a leadframe strip are coated with adhesive prior to die bonding until the point where the individual chips are separated from the leadframe strip rails 12 during a trim and form process, a leadframe strip is treated as a unit in the manufacturing process. Automatic handling machinery is designed to retrieve the partially complete leadframe strip assemblies from leadframe storage devices commonly called carriers. A typical leadframe strip carrier is depicted in FIG. 2. The interior of the carrier has a pair of opposed mirror-image grooved faces. Each groove on one face and its mirror-image groove on the opposing face acts as a slot into which a single lead frame strip may be inserted. The carrier of FIG. 2 is capable of supporting twenty-seven leadframe strips. The current generation of leadframe strip carriers suffers from two drawbacks: high cost of manufacture and inconvenient design.

It is not uncommon for leadframe strip carriers to cost in excess of $250 per unit. This cost is especially significant considering that a semiconductor manufacturer may need several thousand carriers of various sizes, and than since the carriers are subject to damage and wear during the semiconductor manufacturing process, they are not expected to last much more than a single year. The high cost of leadframe strip carriers is primarily due to the fact that they are invariably manufactured from aluminum extrusions. The manufacturing process requires that each carrier begin as a cut section of extrusion. Then, both ends of each leadframe strip slot must be relieved, both horizontally and vertically, to facilitate introduction of leadframe strips into the slots by mechanical leadframe strip-handling equipment. Finally, an end cap retaining groove must be machined on each side near one end of the carrier. The open end having the grooves can be closed with a cap, the cupped edges of which mate with the grooves.

Since leadframe strips come in any number of widths, a different extrusion must be used for each size of carrier. Typically, carriers having different internal width dimensions also have different external width dimensions. Such a situation complicates production machinery setup as carrier elevators, carrier holders and carrier transport machinery must be adjusted whenever the width of a leadframe strip changes.

It would be highly desirable to design a series of leadframe strip carriers, of which any individual member would have external dimensions identical to any other member of the series, and could be produced for substantially less cost than a carrier produced from an aluminum extrusion.

SUMMARY OF THE INVENTION

The present invention accomplishes the aforementioned desired objectives of low production cost and uniformity of critical external dimensions throughout the leadframe strip carrier series. This has been achieved using an injection molding process employing a single mold which produces constant length, width and height dimensions throughout the series. The mold has an internal form die, the position of which can be varied with spacing inserts that can be either removed or transferred to the other side of the mold cavity as the mold is modified for progressively-narrower leadframe strips. To ensure durability, highly-abrasive-resistant, fiber-reinforced plastic material is used to create the carriers. Although the carriers could be molded as an integral unit, mold construction is greatly simplified by molding two identical halves and bonding them together. As another simplification technique, end cap grooves are molded at both ends.

PREFERRED EMBODIMENT OF THE INVENTION

Figure 3A:
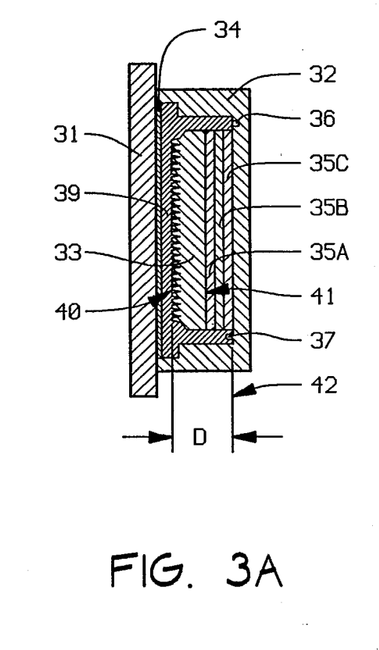
FIG. 3A is a cross-sectional view taken at the middle of a leadframe carrier series mold constructed in accordance with the present invention, set up for the manufacture of a carrier of maximum internal width and showing three removable spacing inserts.

FIG. 3A is a cross sectional view of a laterally and longitudinally symmetrical leadframe carrier series mold, taken through the longitudinal plane of symmetry. The mold is comprised of essentially three basic components: an essentially U-shaped (on the part-forming surface) external form die 32, a planar (on the part-forming surface) external form die 31 which is separably attached to U-shaped external form die 32, and an adjustable internal form die 33 rigidly and detachably affixed to said U-shaped external form die 32. Internal form die 33 has a grooved face 40 which is parallel to and directly opposite the part-forming face of planar external form die 31, and imparts the leadframe-supporting grooves to a molded carrier half. Internal form die 33 also has a planar face 41 that is parallel to grooved face 40. An end cap groove-forming strip of rectangular cross-section 34 is mounted near each end of planar external form die 31. The position of internal form die 33, with respect to planar form die 31 and U-shaped external form die 32, may be varied by means of removable spacer inserts 35A, 35B and 35C, which can be installed singularly or jointly between the planar face 41 internal form die 33 and the portion of U-shaped external form die 32 that is coplanar with the carrier half mating surface-forming plane of the mold. The greater the displacement of internal form die 33 toward planar form die 31, the greater the width of the lead frame-holding slots in a finished molded carrier. For a selected leadframe carrier, the displacement of internal form die 33, as measured by the perpendicular distance (D) from the grooved face thereof to the carrier half mating surface-forming plane of the mold (represented by line 42 in FIG. 3A), will be equal to one-half the selected carrier's slot-width dimension. A male alignment protrusion forming recess 36, as well as a female alignment recess forming protrusion 37, are also shown. Both recess 36 and protrusion 37 are loacted on portions of U-shaped external form die 32 which are located on the carrier half mating surface-forming plane of the mold and which create the mating/bonding edges on a molded carrier half. Of course, U-shaped external form die 32 must be capped to define the ends of a desired carrier. The mold caps 39 may either be separate planar plates attachable to each end of external form die 32, or integral with U-shaped external form die 32.

Figure 3B:
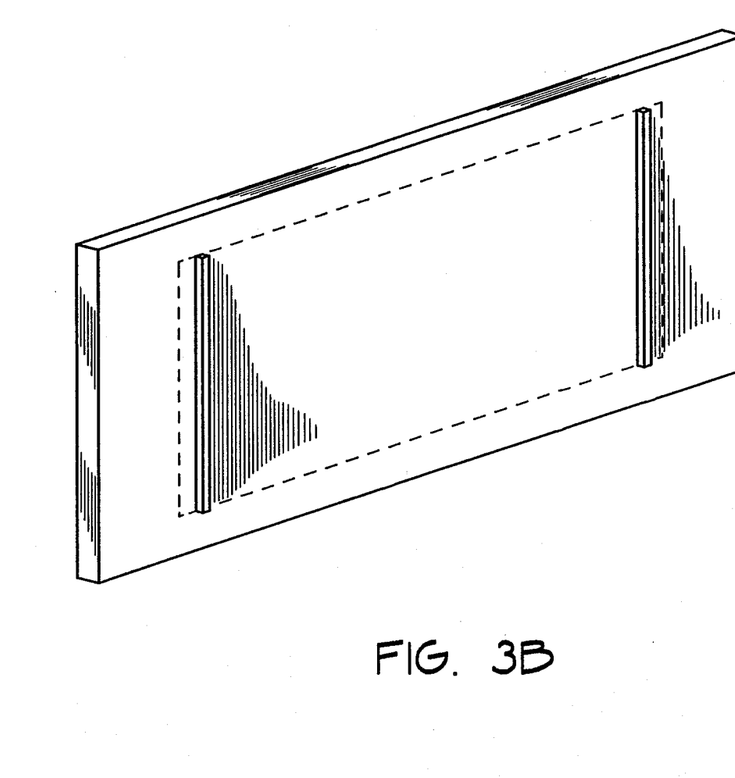
FIG. 3B is a perspective view of the planar external die of the mold of FIG. 3A, showing the attached groove-forming strips.

Referring now to FIG. 3B, the perspective view of planar external form die 31 more clearly shows the pair of groove-forming strips 34. The broken line 38 indicates the limits of the mold interior.

Figure 4:
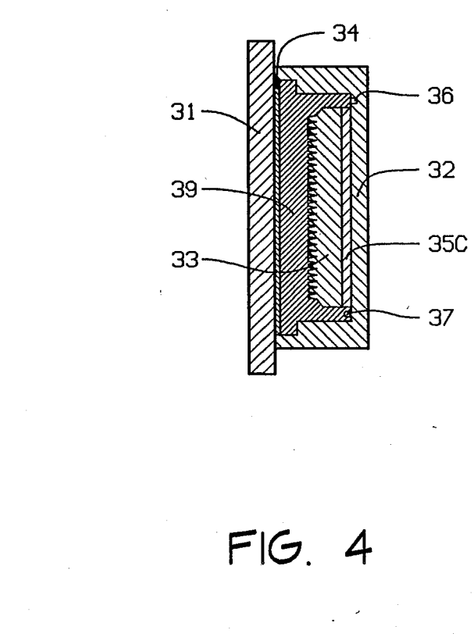
FIG. 4 is a cross-sectional view of the mold of FIG. 3A, modified for the manufacture of a carrier of narrower internal width by the removal of two spacing inserts.
Figure 5A:
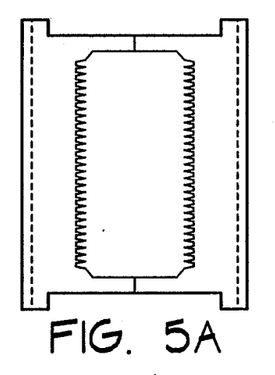
FIGS. 5A through 5D are front elevational views of each of four carriers within a particular series manufactured in accordance with the present invention by the consecutive removal of spacing inserts.
Figure 5B:
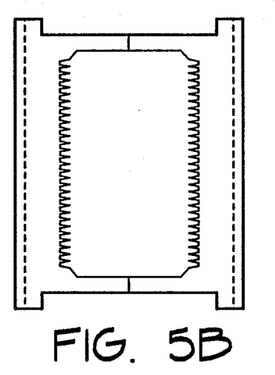
Figure 5C:
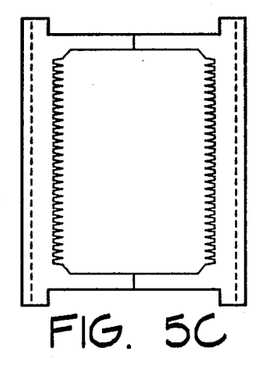
Figure 5D:
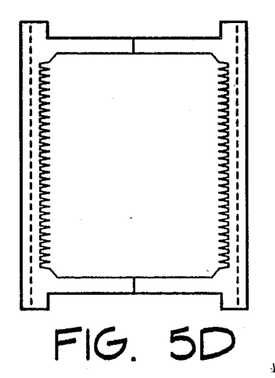

Referring now to FIG. 4, the mold of FIG. 3 has been modified by removing spacer inserts 35A and 35B in order to mold carrier halves used for a narrower leadframe strip.

FIGS. 5A through 5D are front elevational views of each of four carriers within the series of those fabricable using the mold depicted in FIG. 3A. The carrier of FIG. 5A was molded with spacer inserts 35A, 35B and 35C installed between internal form die 33 and U-shaped external form die 32; the carrier of FIG. 5B was molded with spacer inserts 35B and 35C installed, the carrier of FIG. 5C was molded with spacer insert 35C installed; and the carrier of FIG. 5D was molded with all three spacer inserts 35A, 35B and 35C removed.

Figure 6A:
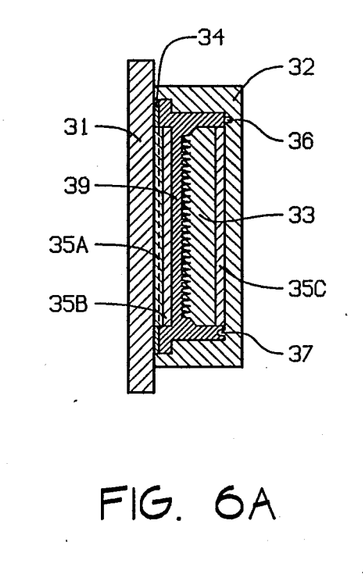
FIG. 6A is a cross-sectional view of the mold of FIG. 3A, modified for the manufacture of a carrier of the same internal width as the one to be produced by the mold of FIG. 4, but with the displaced spacing inserts moved to the other side of the mold.

Referring now to FIG. 6A, the molding procedure has been modified. Using essentially the same mold components as those used for the mold of FIG. 3A, the mold of FIG. 6A is set up for production of a leadframe strip carrier of identical width as that for which the mold of FIG. 3A was setup. However, instead of removing spacer inserts 35A and 35B from the mold as internal form die 33 is positioned closer to U-shaped external form die 32, spacer inserts 35A and 35B are transferred to the opposite side of the mold and attached to planar external form die 31. This is done to reduce the amount of reinforced plastic material required in the molding of carriers having narrower leadframe strip grooves. Actually, the process ensures that all carriers will require essentially identical amounts of reinforced plastic material. The only required modification to the mold is to make the portion of groove-forming strips 34 removable so that spacer inserts 35A, 35B and 35C can be placed flush against planar external form die 31.

Figure 6B:
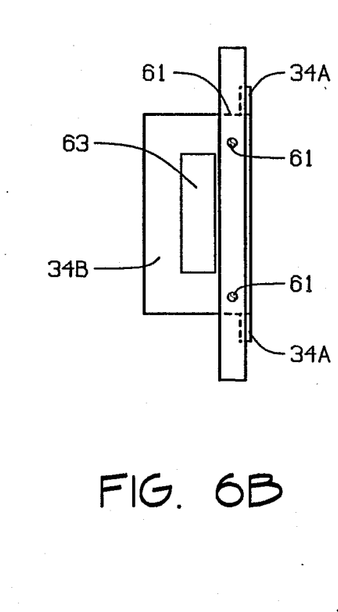
FIG. 6B is an elevational view of the end of a modified planar external form die.
Figure 7A:
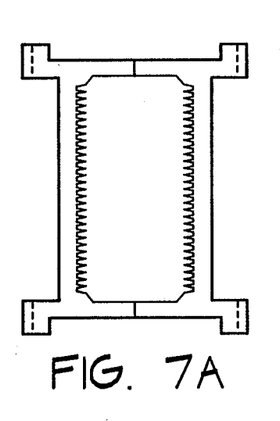
FIGS. 7A through 7D are front elevational views of each of four carriers within a particular series manufactured in accordance with the present invention by transferring consecutive spacing inserts to the other side of the mold.
Figure 7B:
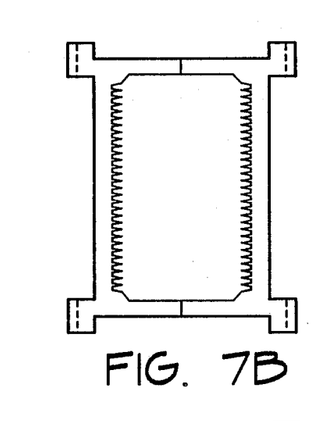
Figure 7C:
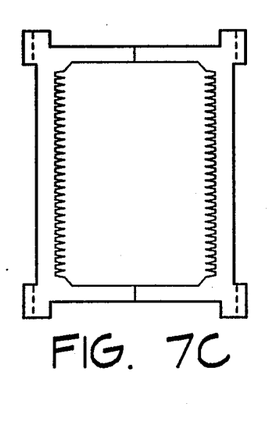
Figure 7D:
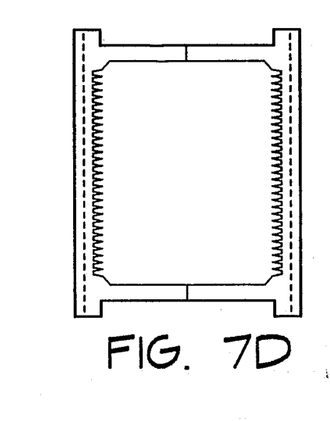

FIG. 6B details a technique for facilitating the removal of the desired portion of groove-forming strips 34 from planar external form die 31. Each groove-forming strip 34 is formed from three sections: a pair of non-removable portions 34A, which are permanently imbedded in planar form die 31, and a removable portion 34B, which slides into a receiver slot 61 in planar form die 31 and is secured in place by screw-in set pins 63. The set pins 63 are accessible at each end of planar form die 31. Rectangular slot 65 permits removable portion 34B to be pried evenly from receiver slot 61.

FIGS. 7A through 7D are front elevational views of each of four carriers within the series of those fabricatable using the mold of FIG. 6A. The series differs from the series depicted in FIG. 5 in that the molding process described in the previous paragraph is employed to minimize the use of reinforced plastic material without significantly compromising rigidity and strength. The carrier of FIG. 7A was molded with spacer inserts 35A, 35B and 35C in place behind internal form die 33; the carrier of FIG. 7B was molded with spacer inserts 35B and 35C in place behind internal form die 33, with spacer insert 35A transferred to the opposite side of the mold; the carrier of FIG. 7C was molded with spacer insert 35C in place behind internal form die 33, with spacer inserts 35A and 35B transferred to the opposite side of the mold; and the carrier of FIG. 7D was molded with all three spacer inserts 35A, 35B and 35C removed from behind internal form die 33 and transferred to the opposite side of the mold.

Figure 8:
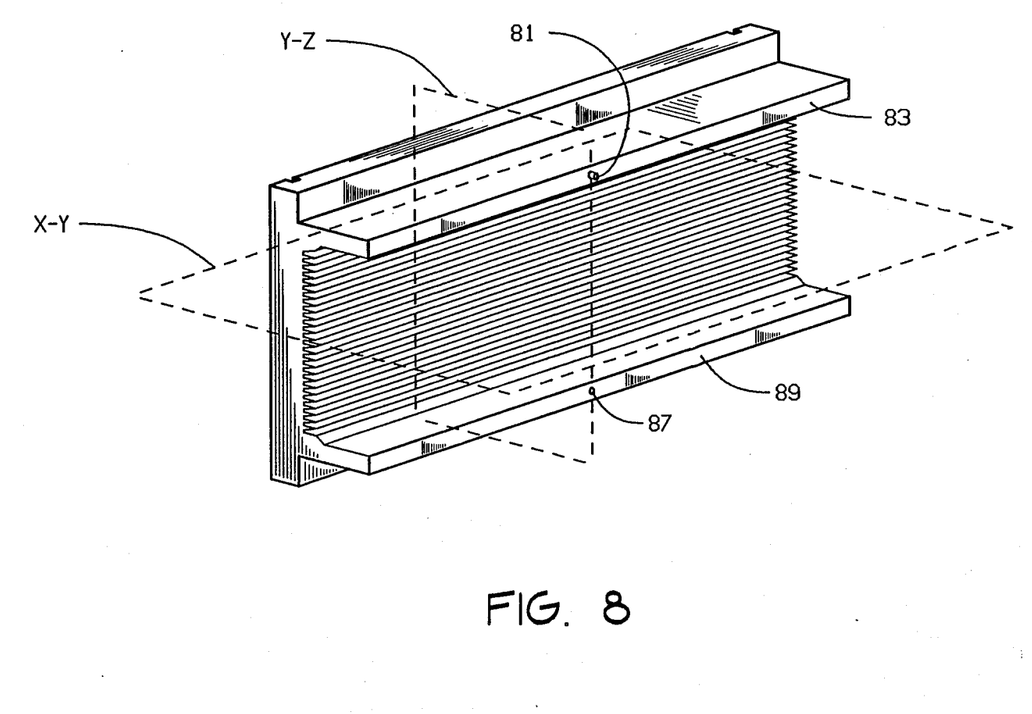
FIG. 8 is a perspective view of the interior of carrier half.

FIG. 8 depicts the interior of a completed carrier half. It is symmetrical about plane x-y, a plane of horizontal orientation, and about plane y-z, a plane of vertical orientation. Once a pair of carrier halves have been molded, they may be bonded together by any number of techniques such as ultrasonic welding or epoxy bonding. In order to ensure that the two halves are sufficiently aligned prior to bonding, one or more male alignment protrusions 81 are molded into one of the mating edges 83 on each carrier half, while one or more female alignment recesses 87 are molded into the other mating edge 89. SInce each carrier half is symmetrical about planes x-y and y-z, a pair of carrier halves may be rotated such that the male alignment protrusions 81 of one-half mate with the female alignment recesses 87 of the other and visa versa.

I claim:

1. A method of manufacturing a leadframe strip carrier selected from a series of carriers, each carrier within said series having identical, fixed external length, width and height dimensions, but different internal width dimensions, consisting of the following steps:

construction of a half-carrier mold;

said mold comprising at least two separable, external form dies which produce constant external length, width and height dimensions throughout said series, an internal form die which is rigidly and detachably affixed to at least one of said external form dies, said internal form die having a grooved face and a parallel planar face, and means for adjusting, over a given range, the displacement of said internal form die from a carrier half mating surface-forming plane of the mold so as to produce a range of internal width dimensions;

adjusting the displacement of said internal form die, such that the perpendicular distance from the grooved face of said internal form die to the carrier half mating surface-forming plane of the mold corresponds to one-half of the selected carrier's slot-width dimension;

molding two identical carrier halves; and aligning and bonding the two carrier halves to form a completed carrier.

2. The method of manufacturing of claim 1, wherein said means for adjusting comprises one or more spacing inserts which can be installed between the planar face of said internal form die and said external form die to which it is affixed, thereby increasing the displacement of said internal form die.

3. The method of manufacturing of claim 2, wherein said mold further comprises an end cap groove-forming strip attached to one of said external form dies near each end thereof.

4. The method of manufacturing of claim 3, wherein carrier wall thickness is maintained constant throughout the series of carriers by transferring spacing inserts removed from between the planar face of said internal form die and said external form die to which it is affixed to a face of an external form die which is directly opposite and parallel to said grooved face.

5. The method of manufacturing of claim 4, wherein a portion of each end cap groove-forming strip is removable to accommodate the transfer of spacing inserts removed from between the planar face of said internal form die and said external form die to which it is affixed to said face of an external form die which is directly opposite and parallel to said grooved face.

6. The method of manufacturing of claim 5, wherein the interior of said mold is both longitudinally and laterally symmetrical.

7. The method of manufacturing of claim 6, wherein said mold further comprises one or more alignment protrusions on a surface of one of said external form dies which lies on said carrier half mating surface-forming plane of the mold and which surface creates one of a pair of mating/bonding edges on a molded carrier half, and one or more alignment recesses on a surface of one of said external form dies which lies on said carrier half mating surface-forming plane of the mold and which creates the other of said pair of mating/bonding edges on a molded carrier half.

8. The method of manufacturing of claim 5, wherein one carrier half alignedly mates with an identical carrier half.

* * * * *

UNITED STATES PATENT AND TRADEMARK OFFICE
CERTIFICATE OF CORRECTION

PATENT NO. : 4,910,866
DATED : March 27, 1990
INVENTOR(S) : Timothy J. Allen

It is certified that error appears in the above—identified patent and that said Letters Patent is hereby corrected as shown below:

Column 1, line 12, delete "water" and insert -- wafer --.

Column 4, line 13, delete "setup" and insert -- set up --.

Signed and Sealed this

Fifteenth Day of March, 1994

Attest:

BRUCE LEHMAN

*Attesting Officer*          *Commissioner of Patents and Trademarks*